US008897024B2

(12) United States Patent
Ihara et al.

(10) Patent No.: US 8,897,024 B2
(45) Date of Patent: Nov. 25, 2014

(54) METHOD FOR MANUFACTURING A SUSPENSION BOARD ASSEMBLY SHEET WITH CIRCUITS (71) Applicant: Nitto Denko Corporation, Ibaraki (JP)

(72) Inventors: Terukazu Ihara, Ibaraki (JP); Tetsuya Ohsawa, Ibaraki (JP)

(73) Assignee: Nitto Denko Corporation, Ibaraki-shi, Osaka (JP)

( * ) Notice: Subject to any disclaimer, the term of this patent is extended or adjusted under 35 U.S.C. 154(b) by 0 days.

(21) Appl. No.: 13/888,889

(22) Filed: May 7, 2013

(65) Prior Publication Data

US 2013/0247371 A1  Sep. 26, 2013

Related U.S. Application Data (62) Division of application No. 12/874,846, filed on Sep. 2, 2010, now Pat. No. 8,477,507.

(60) Provisional application No. 61/243,560, filed on Sep. 18, 2009.

(30) Foreign Application Priority Data

Sep. 9, 2009 (JP) ................................. 2009-207662

(51) Int. Cl.
H05K 1/00 (2006.01)
H05K 3/00 (2006.01)
H05K 1/02 (2006.01)
G11B 5/48 (2006.01)
H05K 1/05 (2006.01)

(52) U.S. Cl.
CPC .............. H05K 3/00 (2013.01); H05K 3/0097 (2013.01); H05K 1/0269 (2013.01);

(Continued)

(58) Field of Classification Search
CPC ... H05K 3/0097; H05K 1/0269; H05K 1/026; H05K 2201/09127; H05K 2201/09918; H05K 3/0008; H05K 2203/166; H05K 2203/0169; H05K 7/20; H05K 3/0052; H01L 21/00; H01L 21/02; H01L 21/48; H01L 21/56; H01L 21/67; H01L 23/28; H01L 23/31; H01L 23/48; B41F 33/0081; H01K 1/14; H01K 1/026; H01K 1/0269; G01R 31/02; G01R 31/28; G01R 31/304; G01R 31/309; G11B 5/48; G11B 5/484
USPC ......... 361/749; 174/254; 324/750.25, 759.02, 324/763.01
See application file for complete search history.

(56) References Cited

U.S. PATENT DOCUMENTS 4,286,201 A * 8/1981 Roecks et al. ................ 318/640
4,799,175 A 1/1989 Sano et al.
(Continued)

FOREIGN PATENT DOCUMENTS

JP 60-263807 A 12/1985
JP 02-039485 A 2/1990
(Continued)

OTHER PUBLICATIONS

Office Action issued Sep. 6, 2011 in JP Application No. 2009-207662.
(Continued)

Primary Examiner — Xiaoliang Chen
(74) Attorney, Agent, or Firm — Panitch Schwarze Belisario & Nadel LLP (57) ABSTRACT An assembly sheet includes a plurality of suspension boards and a frame member that integrally supports the suspension boards. On a surface of the frame member, a plurality of identification marks for identifying respective positions of the suspension boards in automatic optical inspection are provided corresponding to the suspension boards.

2 Claims, 10 Drawing Sheets (52) U.S. Cl.
CPC ........ *H05K 1/056* (2013.01); *H05K 2203/0169* (2013.01); *H05K 3/0052* (2013.01); *G11B 5/484* (2013.01); *H05K 2201/0969* (2013.01)
USPC . 361/749; 174/254; 324/750.25; 324/759.02; 324/763.01; 204/192.13

(56) References Cited

U.S. PATENT DOCUMENTS

| | | | |
|---|---|---|---|
| 5,883,386 A * | 3/1999 | Tsuyuki et al. | 250/239 |
| 5,894,648 A * | 4/1999 | Hill et al. | 29/33 P |
| 5,905,633 A * | 5/1999 | Shim et al. | 361/704 |
| 5,945,238 A * | 8/1999 | Huggins et al. | 430/5 |
| 6,331,885 B1 * | 12/2001 | Nishi | 355/53 |
| 6,428,658 B1 * | 8/2002 | Asano et al. | 204/192.13 |
| 6,815,729 B1 * | 11/2004 | Brophy et al. | 257/98 |
| 6,873,800 B1 * | 3/2005 | Wei et al. | 398/138 |
| 6,877,939 B2 | 4/2005 | Tomkins et al. | |
| 6,892,449 B1 * | 5/2005 | Brophy et al. | 29/827 |
| 7,129,722 B1 * | 10/2006 | Brophy et al. | 324/750.25 |
| 7,307,853 B2 | 12/2007 | Funada et al. | |
| 7,649,143 B2 | 1/2010 | Ohsawa et al. | |
| 2002/0102477 A1 | 8/2002 | Tanaka et al. | 430/5 |
| 2002/0173070 A1 * | 11/2002 | Bolken et al. | 438/106 |
| 2003/0058191 A1 * | 3/2003 | Yuhara et al. | 345/44 |
| 2003/0128348 A1 * | 7/2003 | Nishi | 355/53 |
| 2003/0209815 A1 * | 11/2003 | Ito et al. | 257/797 |
| 2003/0218730 A1 * | 11/2003 | Murakami et al. | 355/53 |
| 2004/0046940 A1 * | 3/2004 | Yanagisawa | 353/31 |
| 2004/0156026 A1 * | 8/2004 | Kamiya | 355/30 |
| 2005/0168834 A1 * | 8/2005 | Matsumoto et al. | 359/694 |
| 2006/0067684 A1 * | 3/2006 | Kim et al. | 398/22 |
| 2006/0076104 A1 * | 4/2006 | Inaishi | 156/249 |
| 2006/0124946 A1 * | 6/2006 | Fujita | 257/98 |
| 2006/0169486 A1 * | 8/2006 | Funada et al. | 174/254 |
| 2006/0199405 A1 | 9/2006 | Sato et al. | |
| 2007/0003194 A1 * | 1/2007 | Ueno et al. | 385/92 |
| 2007/0170911 A1 * | 7/2007 | Ohsawa et al. | 324/158.1 |
| 2007/0241764 A1 * | 10/2007 | Naito et al. | 324/754 |
| 2007/0293062 A1 | 12/2007 | Sato et al. | |
| 2008/0220553 A1 * | 9/2008 | Park et al. | 438/30 |
| 2008/0289307 A1 * | 11/2008 | Ogyu et al. | 55/523 |
| 2009/0260855 A1 * | 10/2009 | Naito et al. | 174/250 |
| 2010/0032201 A1 | 2/2010 | Ooyabu et al. | |
| 2010/0134128 A1 * | 6/2010 | Hobbs | 324/758 |
| 2010/0175913 A1 * | 7/2010 | Ishigaki | 174/255 |
| 2010/0188779 A1 | 7/2010 | Ohsawa et al. | |
| 2011/0058347 A1 | 3/2011 | Ihara et al. | |
| 2011/0262869 A1 * | 10/2011 | Murakami et al. | 430/319 |
| 2012/0033395 A1 | 2/2012 | Ishii et al. | |
| 2012/0048132 A1 * | 3/2012 | Baccini et al. | 101/118 |

FOREIGN PATENT DOCUMENTS

| | | |
|---|---|---|
| JP | 06-132618 A | 5/1994 |
| JP | 11-328410 A | 11/1999 |
| JP | 2001-101639 A | 4/2001 |
| JP | 2003-218475 A | 7/2003 |
| JP | 2004-200607 A | 7/2004 |

OTHER PUBLICATIONS

Office Action issued Feb. 8, 2014 in CN Application No. 201010256074.3.

* cited by examiner

METHOD FOR MANUFACTURING A SUSPENSION BOARD ASSEMBLY SHEET WITH CIRCUITS

CROSS-REFERENCE TO RELATED APPLICATIONS

This application is a Divisional of U.S. patent application Ser. No. 12/874,846, filed Sep. 2, 2010, which is a non-provisional of Provisional U.S. Application No. 61/243,560 filed Sep. 18, 2009, which is based on Japanese Patent Application No. 2009-207662 filed Sep. 9, 2009, and the disclosure of which is incorporated herein by reference.

BACKGROUND OF THE INVENTION

1. Field of the Invention

The present invention relates to a suspension board assembly sheet with circuits and a method for manufacturing the same.

2. Description of the Background Art

Actuators are employed in drives such as hard disk drives. Such an actuator includes an arm arranged rotatably with respect to a rotation shaft and a suspension board with a circuit (hereinafter, abbreviated as a suspension board) for a magnetic head that is attached to the arm. The suspension board is a printed circuit board for positioning the magnetic head with a desired track of a magnetic disk.

The suspension board is provided with the magnetic head, and connected to another electronic circuit. Conductor traces are formed on the suspension board, and electrical signals are transmitted between the another electronic circuit and the magnetic head through the conductor traces.

A method for mass production of such a suspension board is suggested, where the processes for formation of an insulating layer, conductor traces, and a cover layer are sequentially applied to a long-sized substrate which is continuously or intermittently transported by rollers (see JP 2001-101639 A, for example).

A plurality of suspension boards are formed on the long-sized substrate in the manufacturing process of the suspension boards in JP 2001-101639 A. An assembly of the plurality of suspension boards (hereinafter referred to as an assembly sheet) that is produced as a half-finished product is subjected to inspection for detecting defects (disconnections, short-circuits or the like) in the conductor traces of each suspension board.

Continuity test, automatic optical inspection (AOI), and visual check, for example, of the conductor traces are performed for detecting defects in the conductor traces of the assembly sheet.

For example, the AOI is performed in the following manner. First, the conductor traces in a good state with no defects are imaged by an imaging device, and the obtained image data is stored in a memory as master data. Then, the conductor traces formed on the assembly sheet are imaged by the imaging device, and the obtained image data is stored in the memory as inspection target data. The master data and the inspection target data are subsequently compared with each other, so that the presence/absence of defects in the conductor traces formed on the assembly sheet is determined.

Since the determination obtained through the AOI has limitations in terms of accuracy, the visual check following the AOI is further performed by a worker. However, the visual check puts a heavy burden on the worker and increases inspection cost. Therefore, it is required that the determination accuracy of the AOI is improved to decrease the burden on the worker and the inspection cost.

BRIEF SUMMARY OF THE INVENTION

An object of the present invention is to provide a suspension board assembly sheet with circuits in which the presence/absence of defects in conductor traces can be determined at high accuracy using automatic optical inspection and a method for manufacturing the same.

(1) According to an aspect of the present invention, a suspension board assembly sheet with circuits includes a plurality of suspension boards with the circuits, and a support frame arranged to integrally support the plurality of suspension boards with the circuits, wherein a plurality of identification marks for identifying respective positions of the plurality of suspension boards with the circuits in automatic optical inspection are provided corresponding to the plurality of suspension boards with the circuits, respectively, on a surface of the support frame.

In the suspension board assembly sheet with the circuits, the support frame integrally supports the plurality of suspension boards with the circuits. The plurality of identification marks corresponding to the plurality of suspension boards with the circuits, respectively, are provided on the surface of the support frame. This allows the position of each suspension board with the circuit to be identified in the automatic optical inspection of the plurality of suspension boards with the circuits of the suspension board assembly sheet with the circuits.

The plurality of identification marks are not provided in the suspension boards with the circuits themselves, but provided in the support frame of the suspension board assembly sheet with the circuits. Therefore, the area of each suspension board with the circuit is not increased and the layout of conductor trace is not limited by the identification mark.

The plurality of identification marks are provided corresponding to the plurality of suspension boards with the circuits, respectively, thus improving identification accuracy of the position of each suspension board with the circuit. This improves determination accuracy of the automatic optical inspection. As a result, a burden on a worker and inspection cost resulting from visual check of the suspension board assembly sheet with the circuits can be reduced.

(2) The plurality of suspension boards with the circuits may be supported in an aligned state by the support frame, the plurality of suspension boards with the circuits may have respective one ends and the respective other ends, the support frame may have a first frame portion with which the one ends of the plurality of suspension boards with the circuits are coupled, and a second frame portion with which the other ends of the plurality of suspension boards with the circuits are coupled, and the plurality of identification marks may include a plurality of identification marks provided in the first frame portion corresponding to the one ends of the plurality of suspension boards with the circuits, and a plurality of identification marks provided in the second frame portion corresponding to the other ends of the plurality of suspension boards with the circuits.

In this case, the plurality of identification marks corresponding to the one ends of the plurality of suspension boards with the circuits are provided in the first frame portion of the support frame, and the plurality of identification marks corresponding to the other ends of the plurality of suspension boards with the circuits are provided in the second frame portion of the support frame.

This causes positions of the one end and the other end of each suspension board with the circuit to be identified. Accordingly, the position of each suspension board with the circuit can be accurately identified even when the plurality of suspension boards with the circuits are not precisely aligned in the same direction. This results in further improved determination accuracy of the automatic optical inspection.

(3) The plurality of identification marks in the first frame portion may include a plurality of pairs of first and second identification marks provided corresponding to the one ends of the plurality of suspension boards with the circuits, respectively, and the plurality of identification marks in the second frame portion may include a plurality of pairs of third and fourth identification marks provided corresponding to the other ends of the plurality of suspension boards with the circuits, respectively.

In this case, the first and second identification marks corresponding to the one end of each suspension board with the circuit are provided in the first frame portion, and the third and fourth identification marks corresponding to the other end of each suspension board with the circuit are provided in the second frame portion.

This allows the position of each suspension board with the circuit to be accurately identified even when each suspension board with the circuit has strain in its shape. This results in further improved determination accuracy of the automatic optical inspection.

(4) The first, second, third and fourth identification marks corresponding to each suspension board with the circuit may be arranged to surround the suspension board with the circuit.

In this case, the position of each suspension board with the circuit can be more accurately identified even when each suspension board with the circuit has strain in its shape. This results in further improved determination accuracy of the automatic optical inspection.

(5) The first, second, third and fourth identification marks corresponding to each suspension board with the circuit may be arranged at four corners of a quadrangular region including at least part of the suspension board with the circuit.

In this case, the position of each suspension board with the circuit can be identified at the same accuracy regardless of which portion of the suspension board with the circuit has strain. This does not cause variation in the determination accuracy of the automatic optical inspection.

(6) The plurality of identification marks in the first frame portion may include a plurality of first identification marks provided corresponding to the one ends of the plurality of suspension boards with the circuits, respectively, and the plurality of identification marks in the second frame portion may include a plurality of second identification marks provided corresponding to the other ends of the plurality of suspension boards with the circuits, respectively.

In this case, the first identification mark corresponding to the one end of each suspension board with the circuit is provided in the first frame portion, and the second identification mark corresponding to the other end of each suspension board with the circuit is provided in the second frame portion.

This causes the positions of the one end and the other end of each suspension board with the circuit to be identified. Accordingly, the position of each suspension board with the circuit can be accurately identified even when the plurality of suspension boards with the circuits are not precisely aligned in the same direction. This results in further improved determination accuracy of the automatic optical inspection.

The position of each suspension board with the circuit can be identified by using the first and second identification marks corresponding to each suspension board with the circuit as well as first and second identification marks corresponding to another suspension board with the circuit adjacent thereto. In this case, the position of each suspension board with the circuit can be accurately identified even when each suspension board with the circuit has strain in its shape. This allows the determination accuracy of the automatic optical inspection to be further improved using the smaller number of identification marks.

(7) The plurality of suspension boards with the circuits and the support frame may include a plurality of insulating layers that are integrally formed and a plurality of conductor traces formed on the plurality of insulating layers, respectively, and the plurality of identification marks may be portions of the insulating layers that are exposed because of a plurality of openings formed in the conductor traces of the support frame.

In this case, the portions of the insulating layer that are exposed within the plurality of openings in the conductor traces of the support frame function as the plurality of identification marks.

Accordingly, the identification marks are clearly recognized in the automatic optical inspection. This results in the improved identification accuracy of the positions of the suspension boards with the circuits and the improved determination accuracy of the automatic optical inspection.

(8) The plurality of openings may each have an outer circumference that is continuously curved. In this case, each opening does not have a bent portion in its outline, and therefore the plurality of identification marks having uniform shapes can be easily and accurately formed. This further improves the identification accuracy of the positions of the suspension boards with the circuits and the determination accuracy of the automatic optical inspection.

(9) The plurality of openings may each have a substantially circular shape. In this case, the plurality of identification marks having uniform shapes can be more accurately and easily formed.

(10) A diameter of each of the plurality of openings may be not less than 0.10 mm and not more than 0.15 mm. In this case, the identification marks can be reliably recognized in the automatic optical inspection without increasing the width of the support frame.

(11) A shortest distance between an inner surface of each of the plurality of openings formed in the conductor trace of the support frame and a side surface of the conductor trace of the support frame may be not less than 0.05 mm.

In this case, recognition that each of the openings formed in the conductor trace of the support frame and the side surface of the conductor trace are connected to each other is prevented. This allows the positions of the identification marks to be more reliably recognized in the automatic optical inspection.

(12) According to another aspect of the present invention, a method for manufacturing a suspension board assembly sheet with circuits including a plurality of suspension boards with the circuits and a support frame includes the steps of preparing a metal substrate, forming an insulating layer for the plurality of suspension boards with the circuits and an insulating layer for the support frame on the metal substrate, producing the plurality of suspension boards with the circuits and the support frame by forming conductor traces for the plurality of suspension boards with the circuits on the insulating layer for the plurality of suspension boards with the circuits and forming a conductor trace for the support frame on the insulating layer for the support frame, and providing a plurality of identification marks for identifying respective positions of the plurality of suspension boards with the circuits corresponding to the plurality of suspension boards with the circuits in the conductor trace for the support frame, and identifying the respective positions of the suspension boards with the circuits using the plurality of identification marks and performing automatic optical inspection to the suspension boards with the circuits.

In the suspension board assembly sheet with the circuits, the insulating layer for the plurality of suspension boards with the circuits and the insulating layer for the support frame are formed on the metal substrate. The conductor traces for the plurality of suspension boards with the circuits are formed on the insulating layer for the plurality of suspension boards with the circuits, and the conductor trace for the support frame is formed on the insulating layer for the support frame. In this manner, the plurality of suspension boards with the circuits and the support frame are produced.

At the same time, the plurality of identification marks corresponding to the plurality of suspension boards with the circuits are provided in the conductor trace for the support frame. The positions of the plurality of suspension boards with the circuits are identified by the plurality of identification marks, and each of the suspension boards with the circuits is subjected to the automatic optical inspection.

The plurality of identification marks are not provided in the suspension boards with the circuits themselves, but provided in the support frame of the suspension board assembly sheet with the circuits. Therefore, the area of each suspension board with the circuit is not increased and the layout of the conductor trace is not limited by the identification mark.

The plurality of identification marks are provided corresponding to the plurality of suspension boards with the circuits, respectively, thus improving identification accuracy of the position of each suspension board with the circuit. This improves the determination accuracy of the automatic optical inspection. As a result, a burden on a worker and inspection cost resulting from visual check of the suspension board assembly sheet with the circuits can be reduced.

(13) The step of providing the plurality of identification marks includes the step of providing portions of the insulating layer exposed because of the plurality of openings formed in the conductor trace for the support frame as the plurality of identification marks at the time of formation of the conductor trace for the support frame.

In this case, the portions of the insulating layer that are exposed within the plurality of openings of the conductor trace of the support frame function as the plurality of identification marks.

Accordingly, the identification marks are clearly recognized in the automatic optical inspection. This results in the improved identification accuracy of the positions of the suspension boards with the circuits and the improved determination accuracy of the automatic optical inspection.

Other features, elements, characteristics, and advantages of the present invention will become more apparent from the following description of preferred embodiments of the present invention with reference to the attached drawings.

BRIEF DESCRIPTION OF THE SEVERAL VIEWS OF THE DRAWINGS

The foregoing summary, as well as the following detailed description of the invention, will be better understood when read in conjunction with the appended drawings. For the purpose of illustrating the invention, there are shown in the drawings embodiments which are presently preferred. It should be understood, however, that the invention is not limited to the precise arrangements and instrumentalities shown.

In the drawings.

DETAILED DESCRIPTION OF THE INVENTION

Description will be made of a suspension board assembly sheet with circuits and a method for manufacturing the same according to one embodiment of the present invention while referring to the drawings. The suspension board assembly sheet with the circuits (hereinafter abbreviated as the assembly sheet) refers to a half-finished product in a manufacture process of suspension boards with circuits (hereinafter abbreviated as suspension boards), described below. First, description is made of the configuration of the suspension board.

(1) Configuration of the Suspension Board

Figure 1:
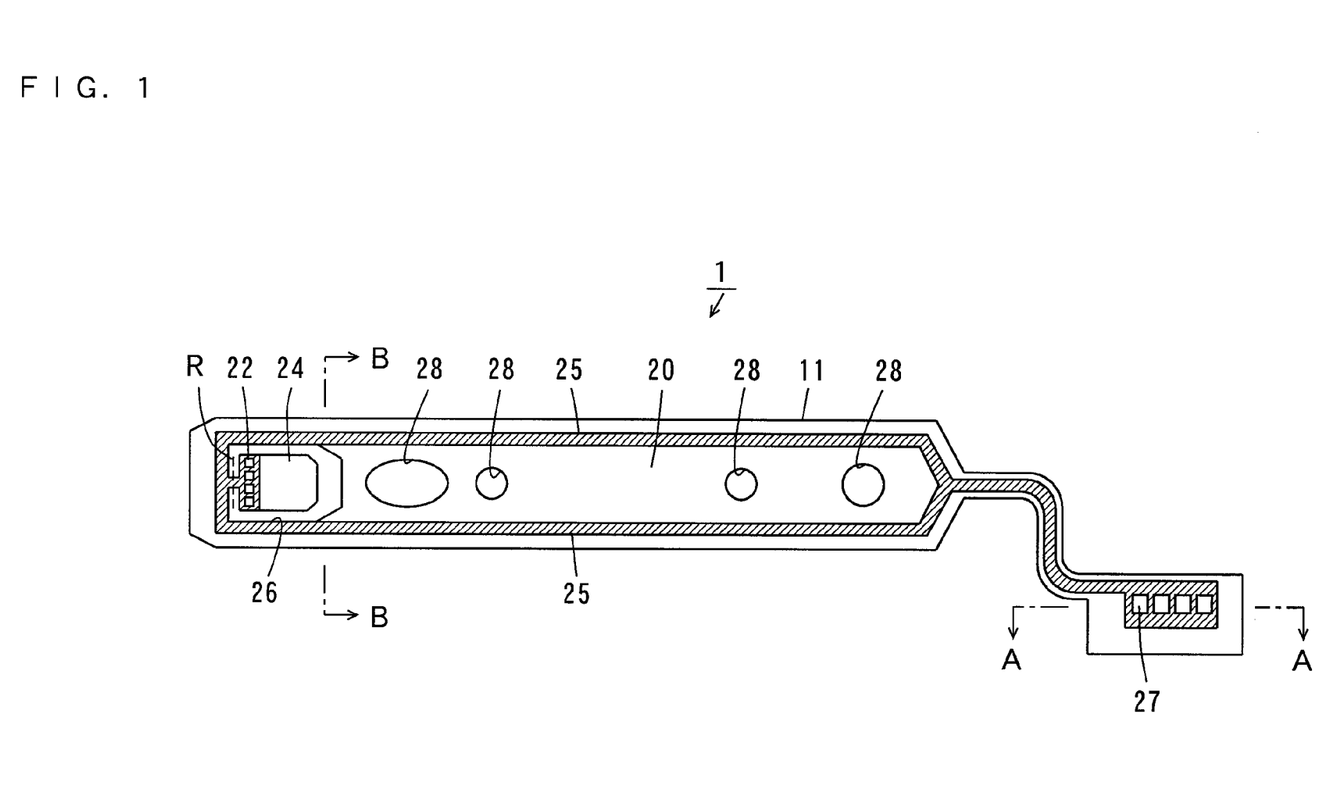
FIG. 1 is a plan view of a suspension board prepared from an assembly sheet according to one embodiment of the present invention.
Figure 2:
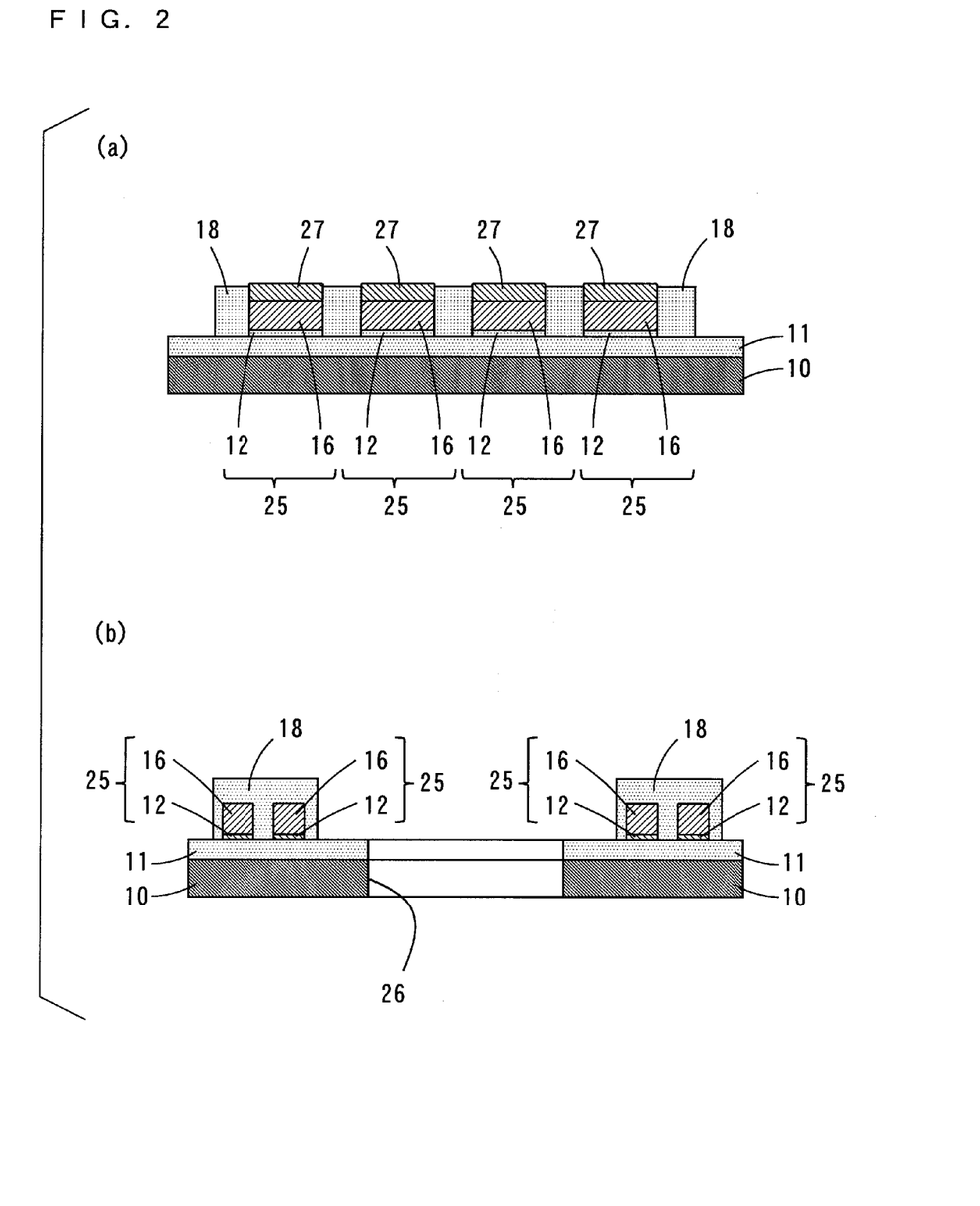
FIG. 2 shows sectional views of the suspension board of FIG. 1 taken along the line A-A and the line B-B, respectively.

FIG. 1 is a plan view of the suspension board prepared from the assembly sheet according to the one embodiment of the present invention. FIGS. 2 (*a*) and 2 (*b*) are sectional views of the suspension board of FIG. 1 taken along the line A-A and the line B-B, respectively.

As shown in FIG. 1, the suspension board 1 includes a suspension body 20 formed of a support substrate 10 (see FIG. 2), described below, and an insulating layer 11. Conductor traces 25 are formed on the suspension body 20. FIG. 1 schematically indicates the conductor traces 25 by hatching. At the tip of the suspension body 20, a U-shaped opening 26 is formed, thereby providing a magnetic head supporting portion (hereinafter referred to as a tongue) 24. The tongue 24 is bent along the broken line R to form a given angle with respect to the suspension body 20.

Four electrode pads 22 are formed at an end of the tongue 24, and four electrode pads 27 are formed at the other end of the suspension body 20. The electrode pads 22 on the tongue 24 and the electrode pads 27 at the other end of the suspension body 20 are electrically connected to one another through the conductor traces 25, respectively. A plurality of holes 28 are formed in the suspension body 20. A cover layer 18 (see FIG. 2), described below, is not shown in FIG. 1.

As shown in FIG. 2(*a*), the insulating layer 11 made of polyimide is formed on the support substrate 10 made of stainless steel at a cross section of FIG. 1 taken along the line A-A. A chromium film 12, and a conductor layer 16 made of copper are sequentially stacked at four positions on the insulating layer 11. Electrode pads 27 made of gold are formed on the conductor layer 16. Upper surface of the insulating layer 11 is covered with the cover layer 18 made of polyimide, with upper surfaces of the electrode pads 27 uncovered.

As shown in FIG. 2(b), the insulating layer 11 made of polyimide is formed on the support substrate 10 made of stainless steel also at a cross section of FIG. 1 taken along the line B-B. The chromium film 12, and the conductor layer 16 made of copper are sequentially stacked at respective two positions on one side portion and the other side portion of the insulating layer 11. The two sets of chromium film 12 and conductor layer 16 on each side portion are covered with the cover layer 18 made of polyimide. Traces each composed of the chromium film 12 and the conductor layer 16 constitute the conductor traces 25.

(2) Manufacture of the Suspension Board

Next, description is made of the method for manufacturing the suspension board 1. In the manufacture process, the assembly sheet according to the one embodiment of the present invention is prepared as the half-finished product.

Figure 3:
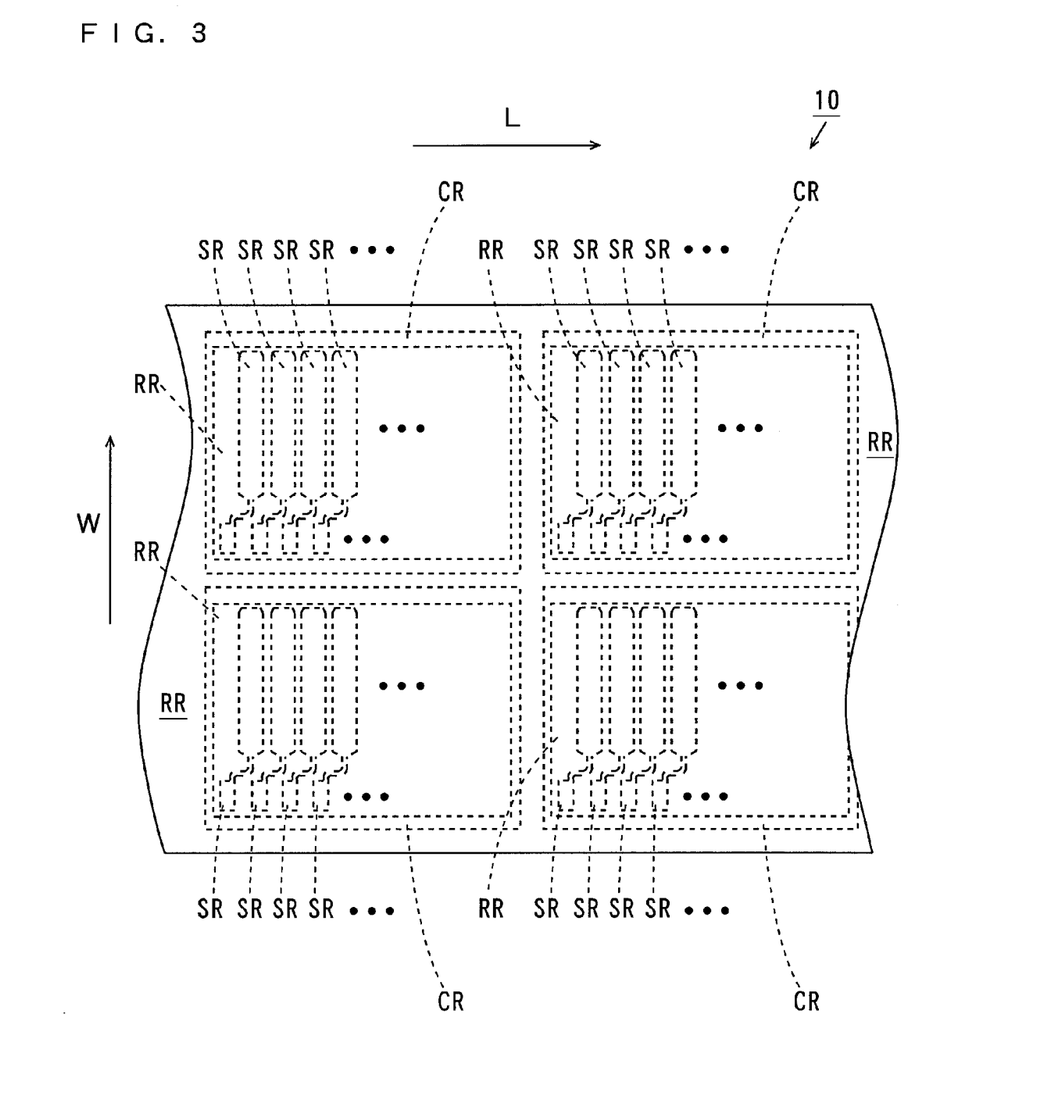
FIG. 3 is a schematic plan view showing a plurality of regions set in a long-sized support substrate.

First, the long-sized support substrate 10 is prepared. A stainless steel plate having a thickness of 15 to 50 μm, for example, can be used as the support substrate 10. A plurality of regions are preliminarily set in the support substrate 10 in this example. FIG. 3 is a schematic plan view showing the plurality of regions set in the long-sized support substrate 10.

As shown in FIG. 3, two rows of a plurality of frame regions CR each having a quadrangular shape are set to be arranged along a longitudinal direction L of the support substrate 10. Inside each frame region CR, a plurality of suspension board formation regions (hereinafter abbreviated as board regions) SR each corresponding to the suspension board 1 of FIG. 1 are set to be arranged along the longitudinal direction L.

Each board region SR corresponding to the suspension board 1 extends in a width direction W of the support substrate 10. Each board region SR has one end and the other end. Inside each frame region CR, coupling regions J (see FIG. 4, described below) that couple the frame region CR and the board regions SR, which are surrounded by the frame region CR, are set. Regions of the support substrate 10 excluding the frame regions CR, the board regions SR and the coupling regions J are set as removal regions RR.

Figure 4:
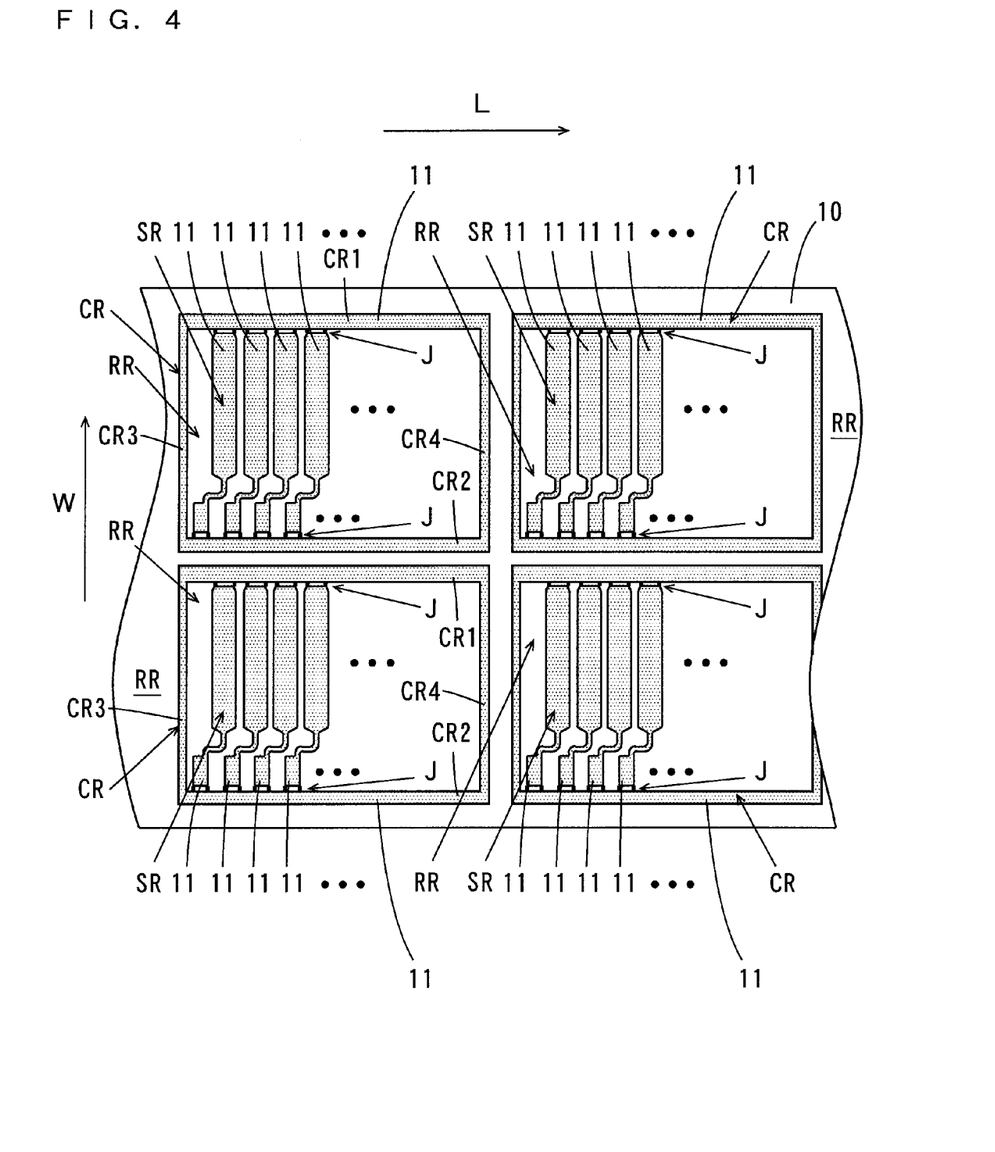
FIG. 4 is a schematic plan view of the support substrate in a process of forming an insulating layer.

Next, the insulating layer 11 made of polyimide is integrally formed in the board regions SR, the frame regions CR and the coupling regions J of the prepared support substrate 10 (a process of forming the insulating layer). FIG. 4 is a schematic plan view of the support substrate 10 in the process of forming the insulating layer. As shown in FIG. 4, the insulting layer 11 is formed in the regions on the support substrate 10 excluding the removal regions RR in the process of forming the insulating layer. The insulating layer 11 formed in the coupling regions J are indicated by the thick solid lines in FIG. 4.

Each frame region CR is composed of parallel frame portions CR1, CR2 that are opposite to each other and parallel frame portions CR3, CR4 that are opposite to each other. The frame portions CR1, CR2 are perpendicular to the frame portions CR3, CR4.

Specific description is made of how the insulating layer 11 is formed. A photosensitive polyimide resin precursor having a thickness of 5 to 25 μm is applied on the support substrate 10. Next, in an exposure device, the photosensitive polyimide resin precursor on the support substrate 10 is irradiated with ultraviolet rays of 200 to 700 mJ/cm² through a given mask. In this manner, the insulating layer 11 made of polyimide is formed in the board regions SR, the frame regions CR and the coupling regions J.

Given patterns of the chromium films 12 and the conductor layers 16, which is made of copper, are subsequently formed on the insulating layer 11 formed in the board regions SR, the frame regions CR and the coupling regions J (a process of forming the conductor traces). The chromium film 12 and the conductor layer 16 formed in the board region SR constitute the conductor traces 25 of FIG. 1.

Figure 5:
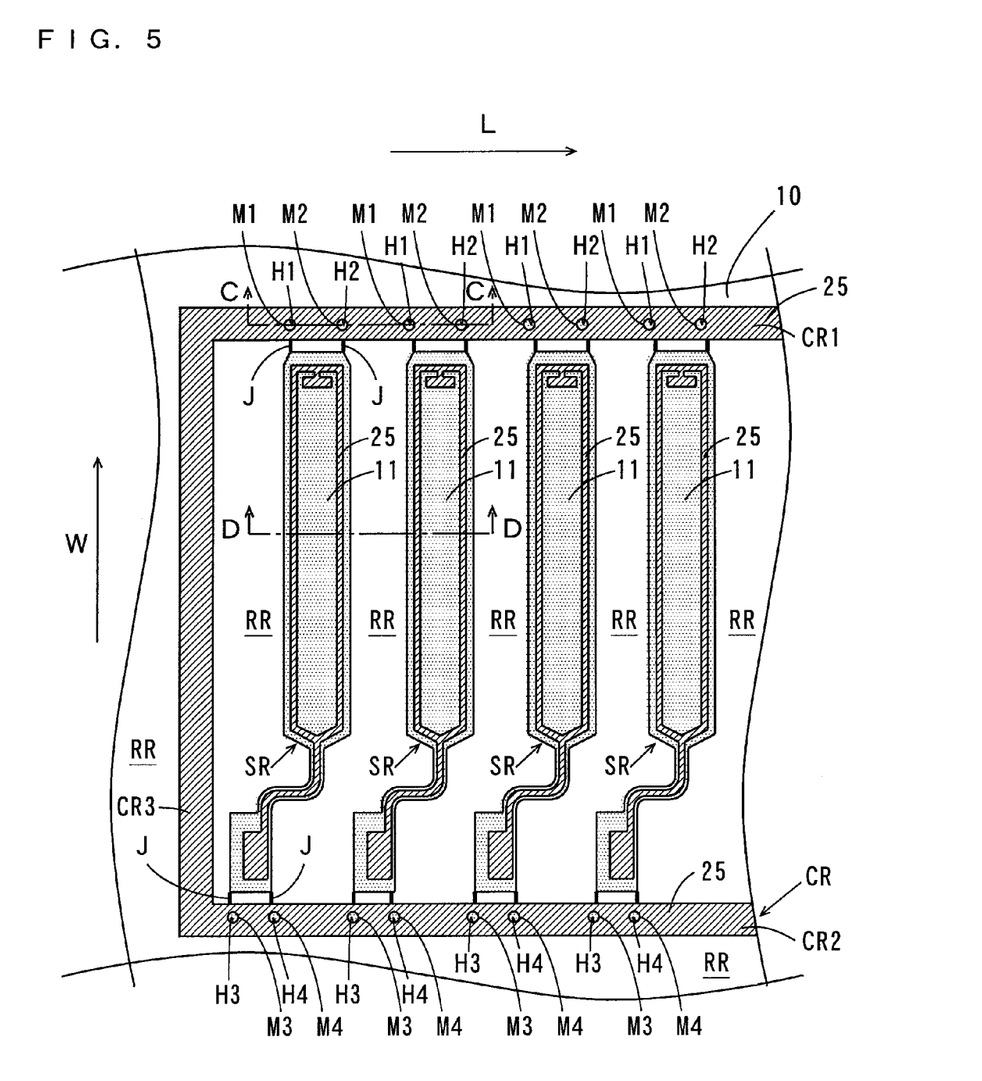
FIG. 5 is a partially enlarged plan view of the support substrate in a process of forming conductor traces.
Figure 6:
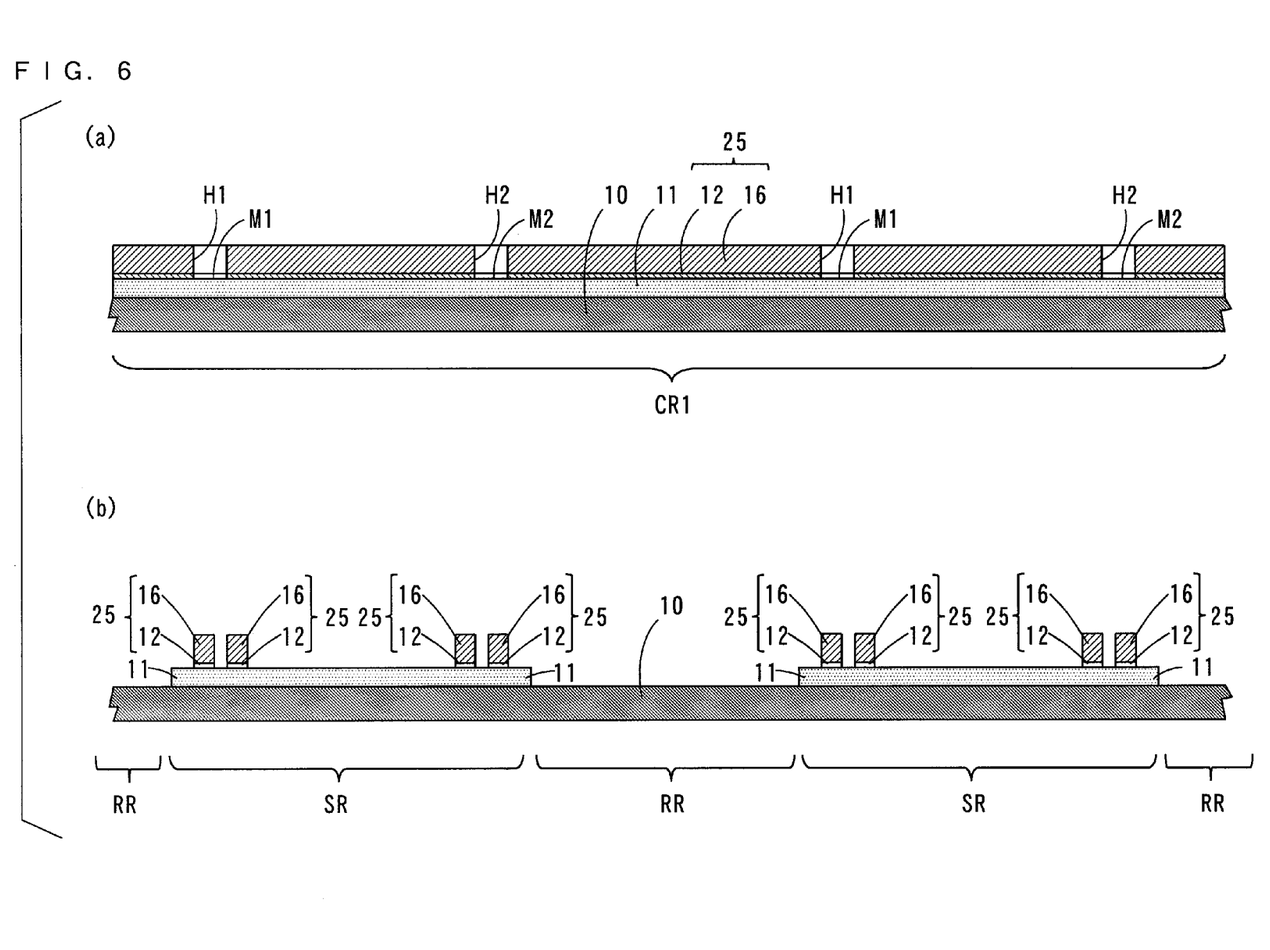
FIG. 6 shows sectional views of FIG. 5 taken along the line C-C and the line D-D, respectively.

FIG. 5 is a partially enlarged plan view of the support substrate 10 in the process of forming the conductor traces. FIG. 6(a) is a sectional view of FIG. 5 taken along the line C-C and FIG. 6(b) is a sectional view of FIG. 5 taken along the line D-D.

As shown in FIGS. 5 and 6(a), the conductor trace 25 is formed on the insulating layer 11 in the frame region CR in the process of forming the conductor traces. The conductor traces 25 are formed on the insulating layer 11 in the board regions SR in the process of forming the conductor traces as shown in FIGS. 5 and 6(b). The conductor traces 25 are formed on the insulating layer 11 in the coupling regions J so as to couple the conductor traces 25 in the board regions SR with the conductor trace 25 in the frame region CR.

Two openings H1, H2 are formed in the conductor trace 25 formed in the frame portion CR1 of the frame region CR to be close to one end of one board region SR as shown in FIGS. 5 and 6 (a). Two openings H3, H4 are formed in the conductor trace 25 formed in the frame portion CR2 of the frame region CR to be close to the other end of the one board region SR as shown in FIG. 5. The four openings H1 to H4 are formed corresponding to each board region SR.

Portions of the insulating layer 11 that are exposed within the plurality of openings H1 to H4 in the conductor trace 25 in the frame region CR function as a plurality of identification marks M1 to M4. The plurality of identification marks M1 to M4 are used for identifying the position of each suspension board 1 in an automatic optical inspection (AOI) process, described below.

The conductor traces 25 may be formed using an additive method or a semi-additive method, for example. Alternatively, another method such as a subtractive method may be employed.

Description is made of a specific example of formation of the conductor traces 25. First, chromium and copper sputtering is continuously applied onto one surface of the support substrate 10 with the insulating layer 11 formed thereon to sequentially form the chromium film 12 having a thickness of 100 to 600 Å and a copper plating base (not shown) having a thickness of 500 to 2000 Å and sheet resistance of 0.6Ω/□ or lower.

A given pattern (an inverted pattern of the conductor traces 25) of plating resist is formed on the copper plating base. On a portion not having the plating resist formed thereon, a copper plating layer having a thickness of 2 to 15 μm is formed as the conductor layer 16 by electrolytic plating of copper. The thickness of the conductor layer 16 is about 10 μm in this example.

The plating resist is removed, and the portion of the copper plating base on which the plating resist has been removed is then removed by etching using an alkaline processing liquid. The exposed chromium film 12 is subsequently removed by etching using an alkaline processing liquid. In this manner, the conductor traces 25 can be formed.

After the process of forming the conductor traces, a photosensitive polyimide resin precursor is applied on the one surface of the support substrate 10, followed by exposure, heating, development and heat curing processing, so that a given pattern of the cover layer 18 (see FIG. 2) made of polyimide having a thickness of 3 to 5 μm is formed on the insulating layer 11 and the conductor traces 25. In this case, openings for forming the electrode pads are provided in given positions (corresponding to the tongue 24 and the other end of the suspension body 20 of FIG. 1) of the cover layer 18.

The four electrode pads 22 and the four electrode pads 27 are formed at the positions, which correspond to the tongue 24 and the other end of the suspension body 20 of FIG. 1, of the conductor traces 25 formed on the support substrate 10. The electrode pads 22, 27 are formed by electrolytic plating, for example, and each made of a nickel film having a thickness of 1 to 5 μm and gold having a thickness of 1 to 5 μm.

Thereafter, inspection for detecting defects in the conductor traces 25 formed in the plurality of board regions SR is performed. In the present embodiment, continuity test, AOI, and visual check are performed for detecting defects in the conductor traces 25 (a process of detecting defects in the traces).

In the continuity test, electrical continuity of the conductor traces 25 formed on each board region SR is inspected.

Figure 7:
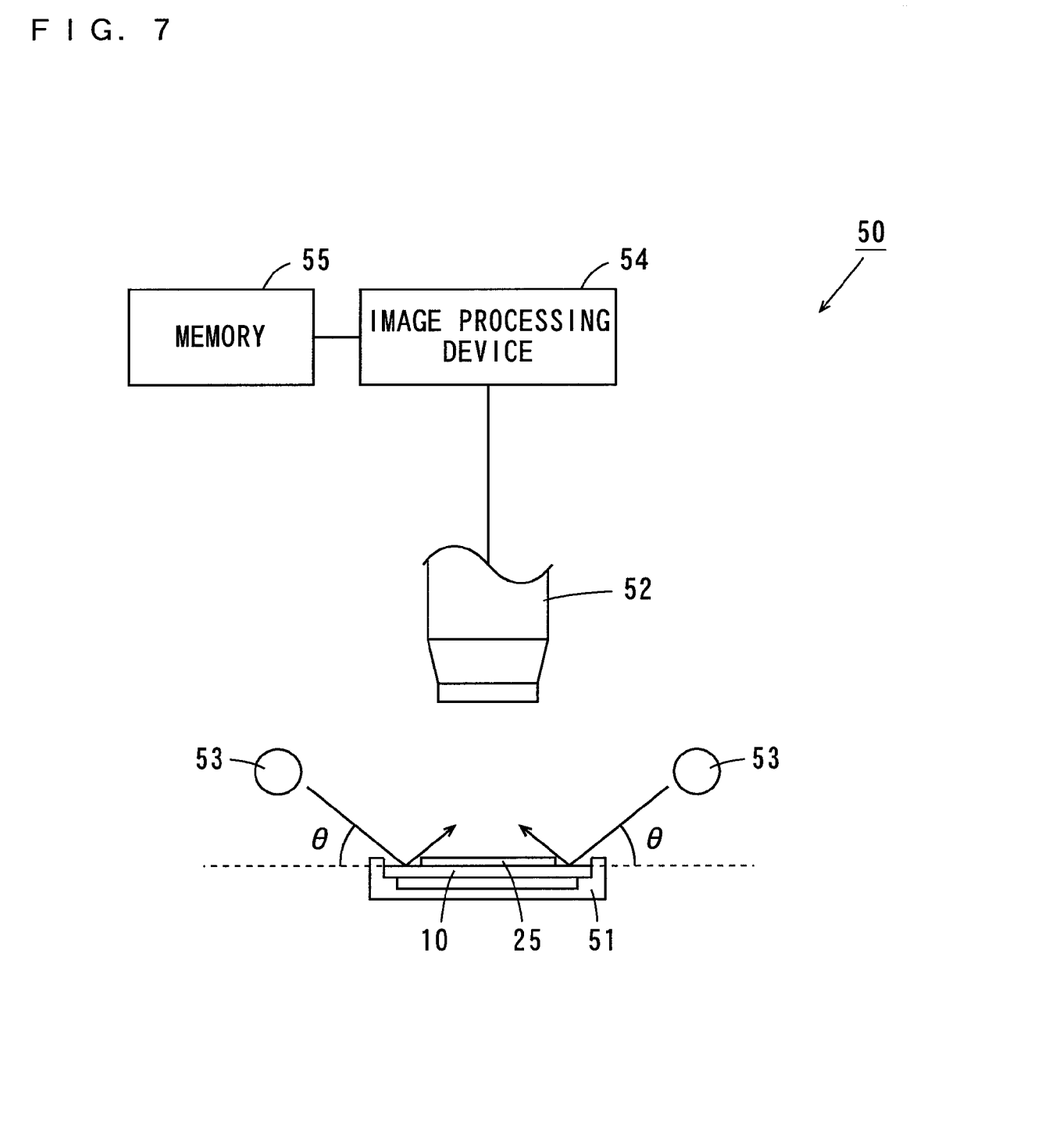
FIG. 7 is a schematic diagram for explaining AOI in a process of detecting defects in the traces.

Description is made of details of the AOI. FIG. 7 is a schematic diagram for explaining the AOI in the process of detecting defects in the traces.

The AOI is performed using an AOI device 50. As shown in FIG. 7, the AOI device 50 includes a board suction base 51, a CCD camera 52, light sources 53, an image processing device 54 and a memory 55.

The CCD camera 52 is provided above the board suction base 51. The board suction base 51 and the CCD camera 52 are arranged one above the other to be opposite to each other. The light sources 53 are provided on sides of the CCD camera 52.

In the AOI device 50, the support substrate 10 is placed on the board suction base 51 such that its surface having the conductor traces 25 formed thereon is opposite to the CCD camera 52. Then, a surface of the support substrate 10 not having the conductor traces 25 formed thereon is sucked onto the board suction base 51. In this manner, the support substrate 10 is fixed onto the board suction base 51.

In this state, light having a given wavelength is directed from each of the light sources 53 to the one surface (the surface having the conductor traces 25 formed thereon) of the fixed support substrate 10 at a given irradiation angle θ. This causes reflected light from the support substrate 10 to be imaged by the CCD camera 52.

The image processing device 54 is composed of a CPU (Central Processing Unit), for example. The image processing device 54 binarizes the image obtained by the CCD camera 52 using a given threshold value, and stores the binarized image data in the memory 55 as inspection target data.

Before the start of the AOI, the support substrate 10 having good conductor traces 25 with no defects is previously imaged by the CCD camera 52, the obtained image data is binarized using the given threshold value, and the binarized image data is stored in the memory 55 as master data.

In the AOI, the image processing device 54 compares the master data stored in the memory 55 with the inspection target data, thereby determining the presence/absence of defects in the conductor traces 25.

At this time, in the frame region CR, the plurality of identification marks M1 to M4 are formed in the conductor trace 25 formed on the support substrate 10 so as to correspond to the board region SR of each suspension board 1.

Accordingly, when the master data and the inspection target data are compared with each other, positions of the respective image data can be adjusted with the identification marks M1 to M4 as reference. As a result, the AOI can be performed at high accuracy.

After the AOI, a worker (a manufacturer of the suspension board 1) performs visual check of positions subjected to the AOI for detecting defects using a microscope. In this manner, the presence/absence of defects in the conductor traces 25 is reliably determined.

Figure 8:
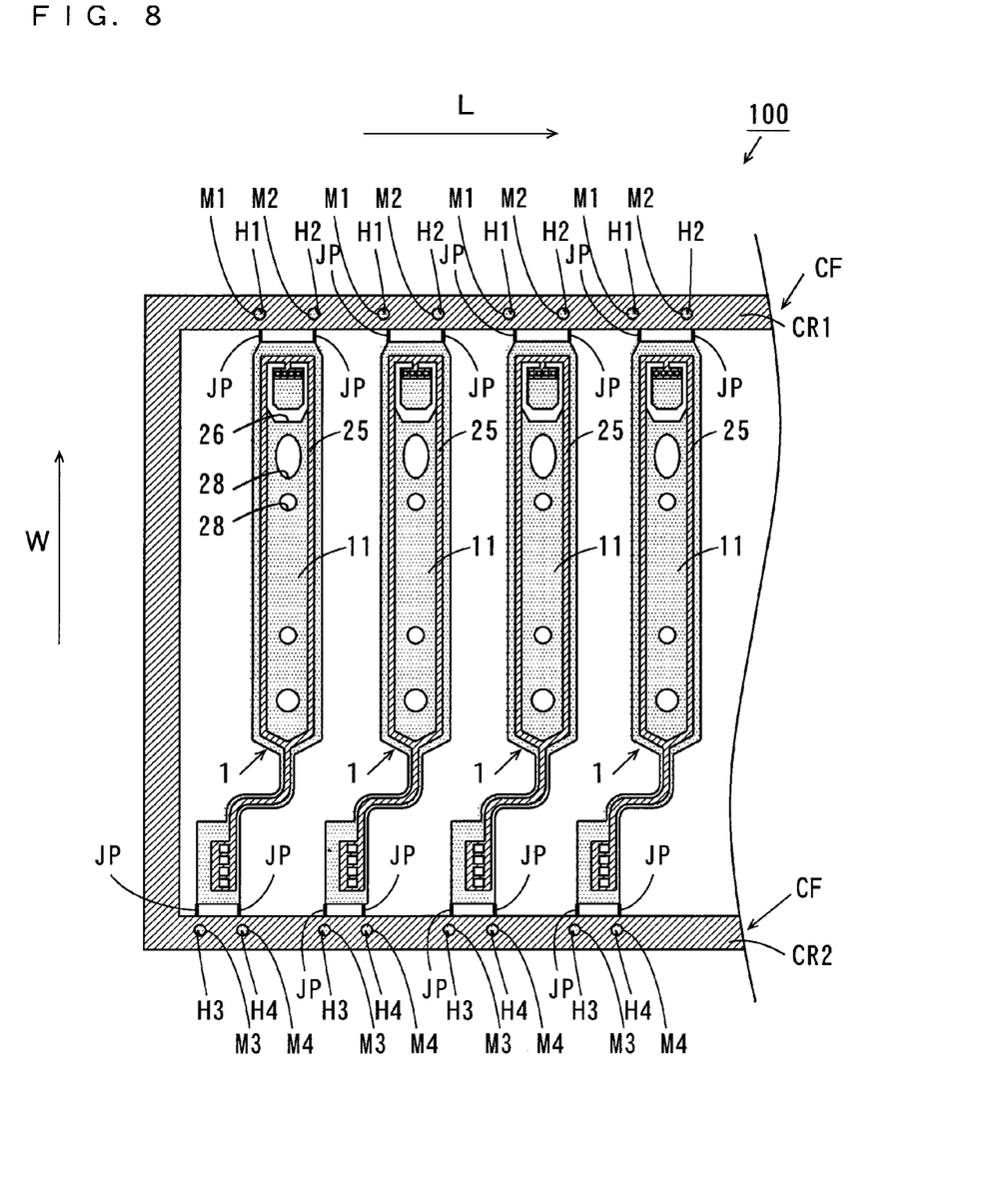
FIG. 8 is a partially enlarged plan view showing the assembly sheet after a cutting out process.

After the process of detecting defects in the traces, the given regions of the support substrate 10 are cut out (a cutting out process). In this manner, the assembly sheet 100 according to the present embodiment is completed. FIG. 8 is a partially enlarged plan view showing the assembly sheet 100 after the cutting out process.

In the cutting out process, portions in the removal regions RR of the support substrate 10 are mainly removed by etching or the like. In addition, portions of the board region SR corresponding to the opening 26 and the plurality of holes 28 of FIG. 1 are removed by etching or the like.

In this manner, a frame member CF composed of the support substrate 10, the insulating layer 11 and the conductor trace 25 is formed corresponding to the foregoing frame region CR, as shown in FIG. 8. The plurality of suspension boards 1 are formed corresponding to the plurality of board regions SR inside the frame member CF. Coupling portions JP each composed of the support substrate 10, the insulating layer 11 and the conductor trace 25 are formed corresponding to the plurality of coupling regions J. Accordingly, the plurality of suspension boards 1 are supported in an aligned state by the frame members CF via the coupling portions JP in the completed assembly sheet 100.

The coupling portions JP of the assembly sheet 100 are cut off, so that the plurality of suspension boards 1 (FIG. 1) can be obtained from the one assembly sheet 100.

(3) Effects

The assembly sheet 100 according to the present embodiment includes the plurality of suspension boards 1 and the frame members CF, and the plurality of suspension boards 1 are supported in the aligned state by the coupling portions JP. The plurality of identification marks M1 to M4 corresponding to the plurality of suspension boards 1 are provided on the surface of the frame member CF. In this manner, the position of each suspension board 1 can be identified at the time of the AOI of the plurality of suspension boards 1 of the assembly sheet 100.

The plurality of identification marks M1 to M4 are not provided in each suspension board 1 itself, but provided in the frame member CF of the assembly sheet 100. Therefore, the area of each suspension board 1 is not increased and the layout of the conductor traces 25 is not limited by the identification marks M1 to M4.

The plurality of identification marks M1 to M4 are provided corresponding to the plurality of suspension boards 1, thus improving the identification accuracy of the position of each suspension board 1. This improves the determination accuracy of the AOI. As a result, a burden on a worker and inspection cost resulting from the visual check of the assembly sheet 100 can be reduced.

The portions of the insulating layer 11 exposed by forming the plurality of openings H1 to H4 in the conductor trace 25 of the frame member CF function as the plurality of identification marks M1 to M4.

Accordingly, the identification marks M1 to M4 are clearly recognized in the AOI. This improves the identification accuracy of the positions of the suspension boards 1 and the determination accuracy of the AOI.

The openings H1 to H4 each have a substantially circular shape. In this case, the outline of each of the openings H1 to H4 does not have a bent portion, thus allowing the plurality of identification marks M1 to M4 having uniform shapes to be accurately and easily formed. This further improves the identification accuracy of the positions of the suspension boards 1 and the determination accuracy of the AOI.

The identification marks M1 to M4 corresponding to each suspension board 1 are formed at four corners of a quadrangular region including the suspension board 1. In this case, the position of each suspension board 1 can be identified at the same accuracy regardless of which portion of the suspension board 1 has strain. This does not cause variation in the determination accuracy of the AOI.

(4) Preferred Range of Dimension of the Openings

Figure 9:
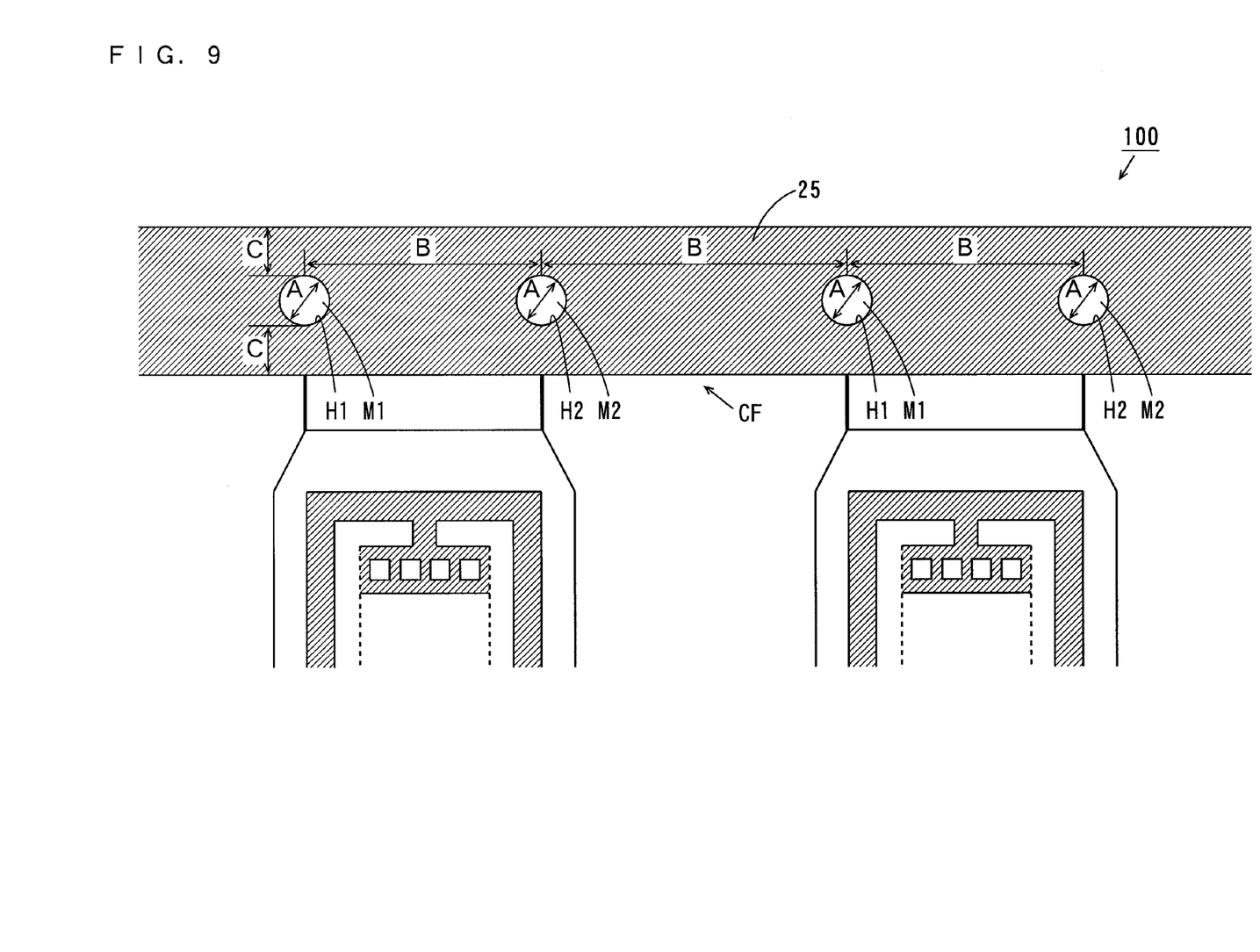
FIG. 9 is an enlarged plan view showing openings of the conductor trace formed on the assembly sheet of FIG. 8 and peripheries thereof.

FIG. 9 is an enlarged plan view showing the openings H1, H2 of the conductor trace 25 formed in the assembly sheet 100 of FIG. 8 and peripheries thereof.

The diameter of each of the openings H1, H2 is represented as A in FIG. 9. When the diameter A of each of the openings H1, H2 is smaller than 0.10 mm, the identification marks M1, M2 cannot be reliably and accurately recognized in some cases depending on resolution of the CCD camera 52 used in the AOI. Meanwhile, when the diameter A is larger than 0.15 mm, the width of the frame member CF needs to be increased in order to form the openings H1, H2 in the frame member CF. Therefore, the diameter A is preferably set to not smaller than 0.10 mm and not larger than 0.15 mm. In this case, the identification marks M1, M2 can be reliably and accurately recognized without increasing the width of the frame member CF even in the case of low resolution of the CCD camera 52 used in the AOI.

An interval between the centers of the openings H1, H2 adjacent to each other is represented as B. When the interval B is less than 0.40 mm, the positions of the identification marks M1, M2 cannot be identified at high accuracy in some cases depending on the resolution of the CCD camera 52 used in the AOI. Therefore, the interval B is preferably set to not less than 0.40 mm. In this case, the positions of the identification marks M1, M2 can be identified at high accuracy even in the case of low resolution of the CCD camera 52 used in the AOI.

The shortest distance between an inner surface of each of the openings H1, H2 and a side surface of the conductor trace 25 of the frame member CF is represented as C. When the distance C is shorter than 0.05 mm, it may be recognized that each of the openings H1, H2 formed in the conductor trace 25 of the frame member CF and the side surface of the conductor trace 25 are connected to each other, depending on the resolution of the CCD camera 52 used in the AOI. Therefore, the distance C is preferably set to not less than 0.05 mm. In this case, the recognition that each of the openings H1, H2 formed in the conductor trace 25 of the frame member CF and the side surface of the conductor trace 25 are connected to each other is prevented even in the case of low resolution of the CCD camera 52 used in the AOI. This allows the positions of the identification marks M1, M2 to be more reliably recognized in the AOI.

(5) Another Embodiment

Figure 10:
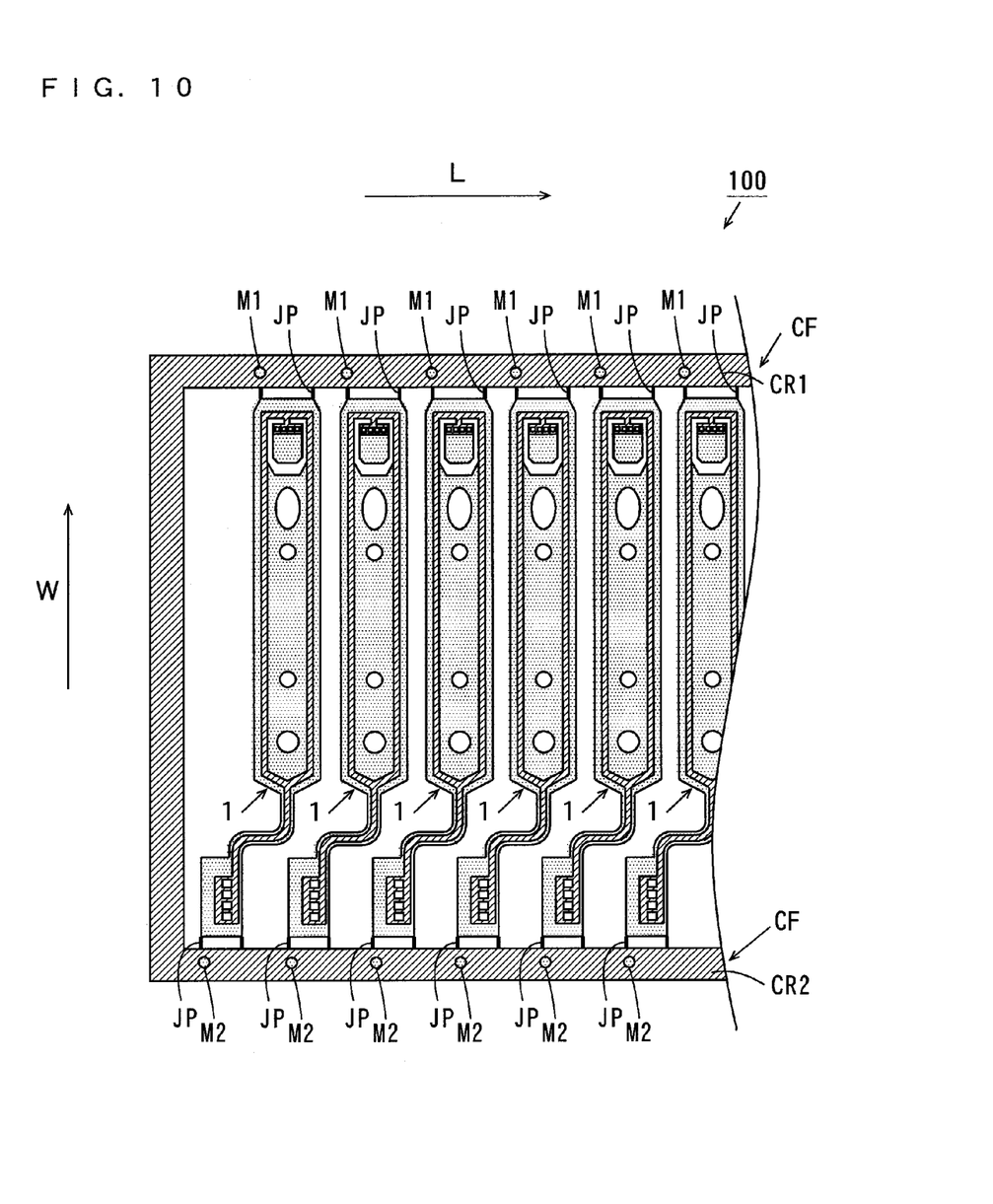
FIG. 10 is a partially enlarged plan view showing an assembly sheet according to another embodiment.

Description will be made of an assembly sheet 100 according to another embodiment by referring to differences from the foregoing embodiment. FIG. 10 is a partially enlarged plan view showing the assembly sheet 100 according to the another embodiment.

As shown in FIG. 10, the plurality of suspension boards 1 are supported in the aligned state in the longitudinal direction L by the frame member CF via the coupling portions JP in the assembly sheet 100 according to the another embodiment.

While the four identification marks M1 to M4 (see FIG. 8) are formed for each suspension board 1 in the foregoing embodiment, two identification marks M1, M2 are formed for each suspension board 1 in the present embodiment.

Specifically, the identification mark M1 is formed corresponding to the one end of each suspension board 1 in the frame portion CR1 of the frame member CF, and the identification mark M2 is formed corresponding to the other end of each suspension board 1 in the frame portion CR2 of the frame member CF.

This causes the positions of the one end and the other end of the suspension board 1 to be identified. Accordingly, the position of each suspension board 1 can be accurately identified even when the plurality of suspension boards 1 are not precisely aligned in the same direction. This results in further improved determination accuracy of the AOI.

The position of each suspension board 1 can be identified using the identification marks M1, M2 corresponding to each suspension board 1 as well as the identification marks M1, M2 corresponding to another suspension board 1 adjacent thereto. In this case, the position of each suspension board 1 can be accurately identified even when each suspension board 1 has strain in its shape. This results in further improved determination accuracy of the AOI using the smaller number of identification marks M1, M2.

(6) Correspondences Between Elements in the Claims and Parts in Embodiments

In the following paragraph, non-limiting examples of correspondences between various elements recited in the claims below and those described above with respect to various preferred embodiments of the present invention are explained.

The assembly sheet 100 is an example of a suspension board assembly sheet with circuits, the suspension board 1 is an example of a suspension board with a circuit, the frame member CF is an example of a support frame, the frame portion CR1 is an example of a first frame portion, and the frame portion CR2 is an example of a second frame portion.

As each of various elements recited in the claims, various other elements having configurations or functions described in the claims can be also used.

While preferred embodiments of the present invention have been described above, it is to be understood that variations and modifications will be apparent to those skilled in the art without departing the scope and spirit of the present invention. The scope of the present invention, therefore, is to be determined solely by the following claims.

It will be appreciated by those skilled in the art that changes could be made to the embodiments described above without departing from the broad inventive concept thereof. It is understood, therefore, that this invention is not limited to the particular embodiments disclosed, but it is intended to cover modifications within the spirit and scope of the present invention as defined by the appended claims.

We claim:

1. A method for manufacturing a suspension board assembly sheet including a plurality of suspension boards with circuits and a support frame, comprising the steps of:

preparing a metal substrate;

forming an insulating layer having a first portion for said plurality of suspension boards and a second portion for said support frame on said metal substrate;

producing the plurality of suspension boards and said support frame by forming first conductor traces for said plurality of suspension boards that constitute the circuits on the first portion of the insulating layer and forming a second conductor trace for said support frame on the second portion of the insulating layer, and providing a plurality of identification marks for identifying respective positions of said plurality of suspension boards corresponding to each of said plurality of suspension boards in the second conductor trace; and identifying the respective positions of the suspension boards using said plurality of identification marks and performing automatic optical inspection to the suspension boards.

2. The method for manufacturing the suspension board assembly sheet according to claim 1, wherein said step of providing the plurality of identification marks includes the step of providing the second portion of the insulating layer exposed because of a plurality of openings formed in the second conductor trace as said plurality of identification marks at the time of formation of the second conductor trace.

* * * * *